United States Patent
Zhang et al.

(10) Patent No.: US 9,595,990 B1
(45) Date of Patent: Mar. 14, 2017

(54) CIRCUIT FOR AND METHOD OF ENABLING THE ADAPTATION OF AN AUTOMATIC GAIN CONTROL CIRCUIT

(71) Applicant: Xilinx, Inc., San Jose, CA (US)

(72) Inventors: Hongtao Zhang, San Jose, CA (US); Geoffrey Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/158,420

(22) Filed: May 18, 2016

(51) Int. Cl.
*H04L 27/06* (2006.01)
*H04B 1/12* (2006.01)
*H03G 3/20* (2006.01)

(52) U.S. Cl.
CPC .............. *H04B 1/123* (2013.01); *H03G 3/20* (2013.01)

(58) Field of Classification Search
CPC .................................. H04B 1/123; H03G 3/20
See application file for complete search history.

(56) References Cited

U.S. PATENT DOCUMENTS

| | | | |
|---|---|---|---|
| 6,356,160 B1 | 3/2002 | Grung et al. | |
| 6,809,676 B1 | 10/2004 | Younis et al. | |
| 6,876,698 B1 | 4/2005 | Dick et al. | |
| 7,539,241 B1 | 5/2009 | Dick | |
| 7,639,735 B1 | 12/2009 | Dick et al. | |
| 7,813,262 B1 | 10/2010 | Rao | |
| 7,929,651 B1 | 4/2011 | Harris et al. | |
| 8,077,219 B2 | 12/2011 | Delva et al. | |
| 8,155,071 B1 | 4/2012 | Dick et al. | |
| 8,934,594 B1 | 1/2015 | Malhotra | |
| 8,995,514 B1 | 3/2015 | Asuncion et al. | |
| 9,054,928 B1 | 6/2015 | Copeland | |
| 9,118,447 B1 * | 8/2015 | Malhotra | H04L 27/2338 |
| 9,160,594 B1 | 10/2015 | Copeland | |
| 9,178,503 B2 | 11/2015 | Hsieh | |
| 2005/0180298 A1 * | 8/2005 | Horibe | G11B 20/10009 369/124.1 |
| 2013/0177112 A1 * | 7/2013 | Lan | H04L 5/0046 375/345 |
| 2015/0249555 A1 * | 9/2015 | Mobin | H04L 25/03057 375/233 |

\* cited by examiner

*Primary Examiner* — Dac Ha
(74) *Attorney, Agent, or Firm* — John J. King (57) ABSTRACT

A circuit for enabling an adaptation of an automatic gain control circuit comprises an automatic gain control (ACG) circuit configured to receive an input signal and to generate a boosted input signal. An average peak signal magnitude adaptation circuit is configured to receive an output of a decision circuit and to generate an average peak signal magnitude. An average peak signal target calculation circuit is configured to receive the average peak signal magnitude and detected peak signal magnitudes, wherein the average peak signal magnitude adaptation circuit generates a target peak signal magnitude. An AGC adaptation circuit is configured to receive an average peak signal magnitude and the target peak signal magnitude, wherein the AGC adaptation circuit provides an AGC control signal to the AGC circuit to maximize the effective signal magnitude within an acceptable linearity range.

20 Claims, 5 Drawing Sheets

CIRCUIT FOR AND METHOD OF ENABLING THE ADAPTATION OF AN AUTOMATIC GAIN CONTROL CIRCUIT

TECHNICAL FIELD

The present invention relates generally to integrated circuit devices, and in particular, to circuits for and methods of enabling the adaptation of an automatic gain control circuit in an integrated circuit.

BACKGROUND

Data communication is an important function of many integrated circuits. In high speed data communication, automatic gain control (AGC) on the receiver side is needed to adjust the received signal magnitude to achieve an adequate input swing for the decision logic or data slicer. In most analog based receiver designs, the gain is adjusted such that the averaged peak signal magnitude at the sampling point (commonly referred as h(0) or vpeak) reaches a pre-defined target. However, such an adjustment of the gain could lead to significant circuit nonlinearity when the maximum signal is much larger than the averaged peak signal. When an equalization technique such as feedforward equalization (FFE) or decision feedback equalization (DFE) is used, which is almost ubiquitously required for high speed communication links (e.g. greater than 10 Gbps), this nonlinearity will deteriorate eye margin and hence hurt bit error rate (BER). Alternatively, in many ADC based receiver designs, the gain is adjusted by monitoring the ADC code clipping rate. The clipping rate, however, can be strongly influenced by channel ISI profile, noise amount and crosstalk signature, hence making the adjustment less robust for different systems.

Accordingly, improved circuits for and methods of enabling the adaptation of an automatic gain control circuit when receiving data in an integrated circuit are beneficial.

SUMMARY

A circuit for enabling an adaptation of automatic gain control (AGC) is described. The circuit comprises an automatic gain control circuit configured to receive an input signal and to generate a boosted input signal; an equalization circuit configured to receive the boosted input signal generated by the automatic gain control and to generate an equalized input signal; a decision circuit configured to receive the equalized input signal, wherein the decision circuit generates decision outputs based upon the equalized input signal; an average peak signal magnitude adaptation circuit configured to receive an output of the decision circuit and to generate an average peak signal magnitude; an average peak signal target calculation circuit configured to receive the average peak signal magnitude and a maximum peak signal amplitude, wherein the average peak signal magnitude adaptation circuit generates a target average peak signal magnitude; and an AGC adaptation circuit configured to receive an average peak signal magnitude and the target average peak signal magnitude, wherein the AGC adaptation circuit provides an AGC control signal to the AGC circuit to maximize the input signal magnitude within an acceptable linearity range.

A method of enabling an adaptation of automatic gain control is also described. The method comprises receiving an input signal; generating a boosted input signal based upon the received input signal; generating an equalized signal based upon the boosted input signal; generating decision outputs based upon the boosted input signal; determining an average peak signal magnitude based upon the decision outputs; determining a target peak signal magnitude based upon the average peak signal magnitude and a maximum peak signal amplitude; and maximizing a signal magnitude of the input signal within an acceptable linearity range based upon the average peak signal magnitude and the target average peak signal magnitude.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below maximize the effective signal magnitude within the acceptable linearity range or an ADC full scale range (FSR) by adapting the h(0) target based on the channel insertion loss in the presence of DFE or FFE. That is, the circuits and methods enable the adaptation of the h(0) target based upon DFE or FFE to maximize the achievable h(0) within the linear region or FSR. The circuits and methods maximizes the signal-to-noise (SNR) ratio within the device linear operation range. The circuits and methods can be used for both an ADC based design and analog based design. It is also applicable to either NRZ or multi-level signaling such as PAM4 signaling.

Figure 1:
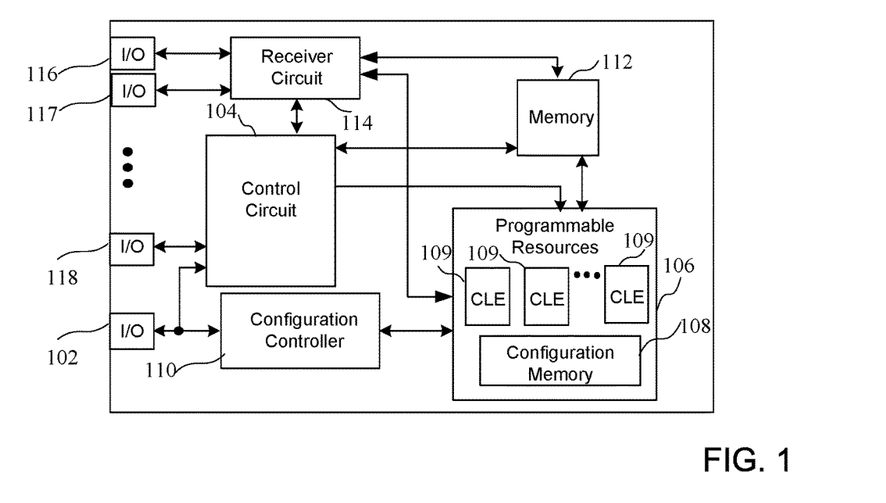
FIG. 1 is a block diagram of a circuit enabling the adaptation of an automatic gain control circuit in an integrated circuit.

Turning first to FIG. 1, a block diagram of an integrated circuit that enables receiving an input signal to generate output data is shown. In particular, an input/output port 102 is coupled to a control circuit 104 that controls programmable resources 106 having configuration memory 108. Configuration data may be provided to the configuration memory 108 by a configuration controller 110. The configuration data enables the operation of configurable elements 109. A memory 112 may be coupled to the control circuit 104 and the programmable resources 106. A receiver circuit 114 may be coupled to the control circuit 104, programmable resources 106 and the memory 112, and may receive signals external to the integrated circuit device by way of an I/O port 116 and an I/O port 117. Other I/O ports may be coupled to circuits of the integrated circuit device, such as I/O port 118 that is coupled to the control circuit 104 as shown. The circuits and methods described in more detail below may be implemented by various elements of the circuit of FIG. 1.

Figure 2:
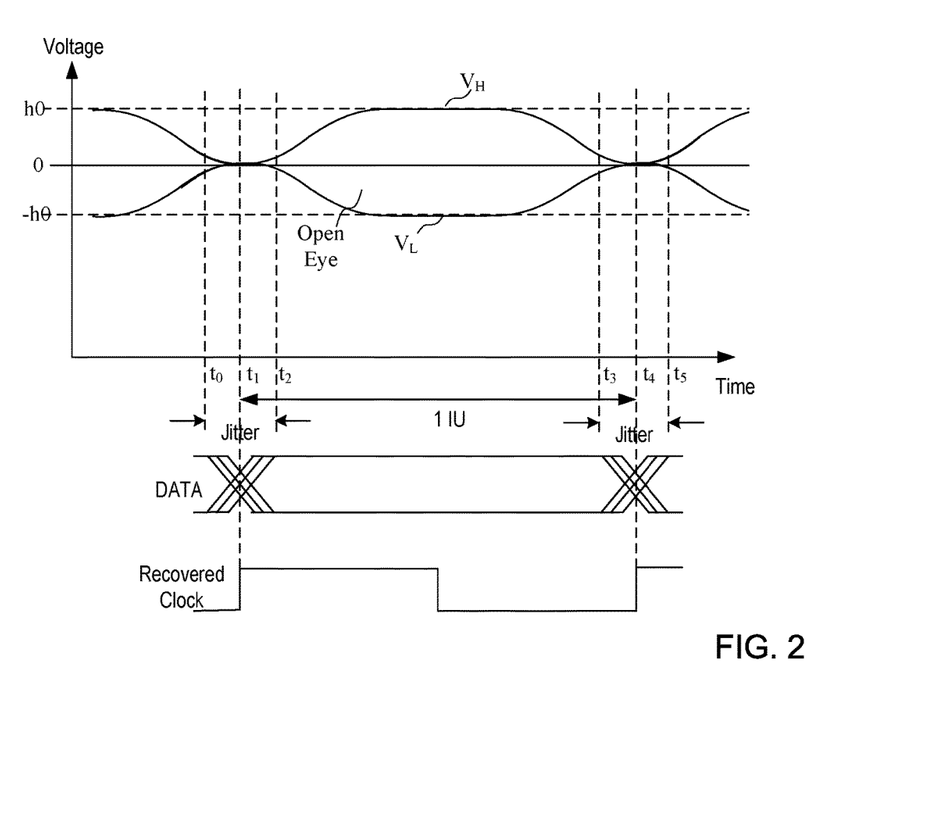
FIG. 2 is an eye diagram showing characteristics for non-return-to-zero (NRZ) data received by a data receiver.
Figure 3:
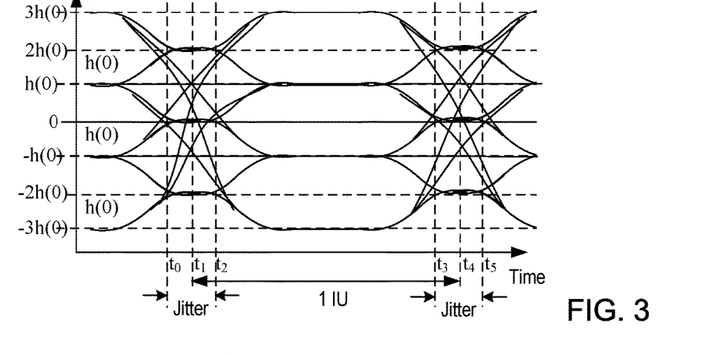
FIG. 3 is an eye diagram showing characteristics for PAM4 data received by a data receiver.

Before describing methods of enabling the adaptation of an automatic gain control circuit, an eye diagram showing characteristics for a received signal will be described in reference to FIGS. 2 and 3. While the example of FIGS. 2 and 3 relate to non-return-to-zero data signals (i.e. a signal varying symmetrically between a positive voltage and a negative voltage) and PAM4 signals, it should be understood that the circuits and methods set forth below could relate to any type of varying input signal. A received AC signal is typically defined by an "eye pattern," where it is desirable to have a large "open eye" portion so that a detected value at a given time in the middle of the eye pattern (i.e. between jitter on either ends of the eye pattern) can easily be detected as being associated with an expected voltage at the top or bottom of the eye pattern. The received data signal of FIG. 2 represents an NRZ input signal that is symmetrical about zero volts, where the expected value at the top of the eye pattern (i.e. a logical "1") is represented by h(0), and the expected value at the bottom of the eye pattern (i.e. a logical "0") is represented by −h(0). The beginning of the unit interval (i.e. the period between time $t_1$ and $t_4$) of the received data is at time $t_1$, where jitter may generally be detected between $t_0$ and $t_2$. The data is preferably detected at the center of the eye pattern (shown by the falling edge of the recovered clock signal approximately half way between $t_2$ and $t_3$) where jitter can be expected to be received in another jitter period between $t_3$ and $t_5$. While the eye pattern of FIG. 2 represents an ideal eye pattern, where the voltage level $V_H$ detected at the top of the eye pattern has a positive voltage value of h(0), and the voltage level $V_L$ detected at the bottom of the eye pattern has a negative voltage value of −h(0), it should be noted that the typical eye pattern for received data over time varies. Therefore, the sharp line representing the eye pattern would be more represented by a much wider pattern representing variations in the detected values over time.

The circuits and methods find particular applications with multi-level outputs such as the multi-levels of a PAM4 data transmission. A PAM4 pattern associated with data is shown in FIG. 3. The diagram of FIG. 3 shows received data signals according to a PAM4 protocol, where the received voltage of the signal may have a value of −3h(0), −h(0), h(0) or 3h(0). According to the PAM4 protocol, a single value can be used to generate two bits of data, where −3h(0) may be represent 00, −h(0) may represent 01, h(0) may represent 10, and 3h(0) may represent 11. In order to determine the appropriate value of a reference voltage to provide for a comparison with a detected value when implementing the PAM4 protocol, a level detection circuit determines in which of 4 possible ranges the detected voltage falls, and compares the detected value to a predetermined value associated with one of the 4 possible ranges. In particular, if a detected value of the input signal is determined to be greater than +2h(0), then the +3h(0) voltage value will be used as the reference value input to a detection circuit. If a detected value of the input signal is determined to be between 0 and +2h(0), then the +h(0) voltage value will be used as the reference value input to the detection circuit. If a detected value of the input signal is determined to be between 0 and −2h(0), then the −h(0) voltage value will be used as the reference value input to the detection circuit. Finally, if a detected value of the input signal is determined to be less than −2h(0), then the −3h(0) voltage value will be used as the reference value input to the detection circuit.

Figure 4:
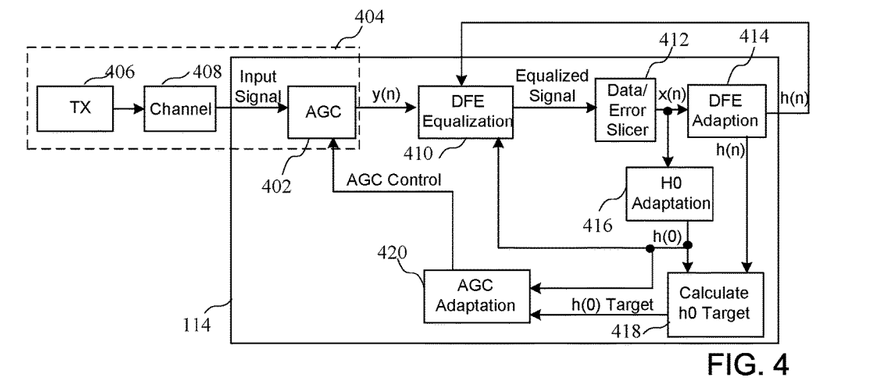
FIG. 4 is a block diagram of a circuit for enabling automatic gain control adaptation in a receiver having a DFE equalizer.

Turning now to FIG. 4, a block diagram of a circuit for enabling automatic gain control adaptation in a receiver having a DFE equalizer is shown. In particular, the receiver 114 comprises an automatic gain control (AGC) circuit 402 that is coupled to receive an input signal, where an equivalent channel 404 associated with the signal transmitted to the receiver is defined by a transmitter 406, a channel 408, and the AGC circuit 402. An output of the AGC circuit 402 is coupled to an equalization circuit 410, shown in the implementation of FIG. 4 as a decision feedback equalization circuit. An equalized signal generated by the decision feedback equalizer is provided to a data/error slicer 412, also known as a decision circuit. An output of the data/error slicer 412—representing the recovered data is provided to an equalizer adaptation circuit shown here as a DFE adaptation circuit 414. The output of the data/error slicer 412 is also provided to an average peak value magnitude adaptation circuit 416. An average peak value magnitude (h(0)) generated by the average peak value magnitude adaptation circuit 416 is coupled to an average peak signal target calculation circuit 418, which generates a target average peak value (h(0) target). The average peak signal target calculation circuit selects a target average peak signal magnitude based upon a circuit linear range of the decision outputs. An AGC adaptation circuit 420 receives both the average peak value magnitude (h(0)) and the target average peak value magnitude (h(o) target). As will be described in more detail below, the AGC adaptation circuit 420 provides an AGC control signal to control the automatic gain control circuit, and more particularly, the gain of the input signal to maximize the achievable h(0) within the linear region or FSR.

In high speed links, the received signal at the sampling point, designated as y(n), is the convolution of the cascaded channel (which includes transmitter analog front end, package, channel, receiver analog front end), pulse response h(n), and signal x(n) after equalization, and is designated by:

$$y(n)=\Sigma h(n-m)\times (m).$$

The expected signal amplitude is h(0)x(0) and all the other terms are ISI and are desired to be removed by DFE or FFE. For convenience, h(n) is set to include the TX swing value so that x(n) can be normalized to a digital signal without amplitude information. The maximum signal magnitude before equalization (e.g. DFE or FFE) is therefore $$ymax=\max(x(n))\Sigma|h(n)|,$$

where the maximum peak signal amplitude is $\Sigma|h(i)|$ for i=0, 1, 2 . . . . The maximum peak signal amplitude can be calculated from h(n). If DFE is used in the system, and the circuit linear range (or half of the FSR in the ADC context) is A, then the h(0) target should be set such that ymax=A, i.e., $$h(0)\text{target}=A/(\max(x(n))\Sigma|h(n)/h(0)|)$$

For example in the case of NRZ, max(x(n))=1, and $$h(0)\text{target}=A/\Sigma|h(n)/h(0)|,$$

while in the case of PAM4, max(x(n))=3, and $$h(0)\text{target}=A/3\Sigma|h(n)/h(0)|.$$

The circuits and methods maximize the effective signal magnitude within an acceptable linearity range or an ADC full scale range (FSR) by adapting the h(0) target based on the channel insertion loss in the presence of DFE or FFE, where the channel insertion loss is measured using s-parameters.

The summation index n starts from 0 to some number defined by a number of taps of the equalization circuit. Typically 10 taps are enough for a good estimation of the h(0)target estimation. If the DFE tap number is less than 10, then some scaling factor can be used for h(0) target estimation. Therefore, the h(0) target is based upon the average peak signal magnitude h(0) and the maximum peak signal amplitude.

Once the h(0) target is obtained, AGC adaptation logic adjusts the gain of the AGC circuit using the AGC control signal. By way of example, the AGC adaptation circuit could adjust the gain according to the following pseudocode:
  If h(0)<h(0) target
  Increase AGC gain
  Else if h(0)>h(0) target
  Decrease AGC gain
  Else
  Keep AGC gain unchanged.
While FIGS. 2 and 3 shown by way of example as having an average peak amplitude values associated with NRZ and PAM4 transmitters, the various circuits and methods are applicable to PAM8, PAM16, or other multilevel signaling protocols as long as the system is linear.

Unlike a conventional device having significant circuit nonlinearity when the maximum signal is much larger than the averaged peak signal (leading to nonlinearity that will deteriorate eye margin and hurt bit error rate), the circuit of FIG. 4 maximizes the effective signal magnitude within the acceptable linearity range by adapting the h(0) target based on the channel insertion loss in the presence of DFE. The averaged peak signal h(0) is typically set to ~80 mV to 120 mV. Due to ISI, the maxim received signal can be much larger than h(0). For example, in lossy NRZ system, h(1), h(−1) can be greater than 50% of h(0), and then there is h(2), h(3) and beyond. The maximum received signal magnitude would be h(0) plus the $\Sigma|h(n)|$ (where n represents the main tap and all other ISI taps) and can reach 300 mV or more. Therefore, the circuit of FIG. 4 enables the adaptation of the h(0) target based upon DFE to maximize the achievable h(0) within the linear region. Similarly, the circuits of FIGS. 6 and 8 also enable the adaptation of the h(0) target based upon FFE to maximize the achievable h(0) within the linear region. The circuits also maximize the signal-to-noise (SNR) ratio within the device linear operation range.

Figure 5:
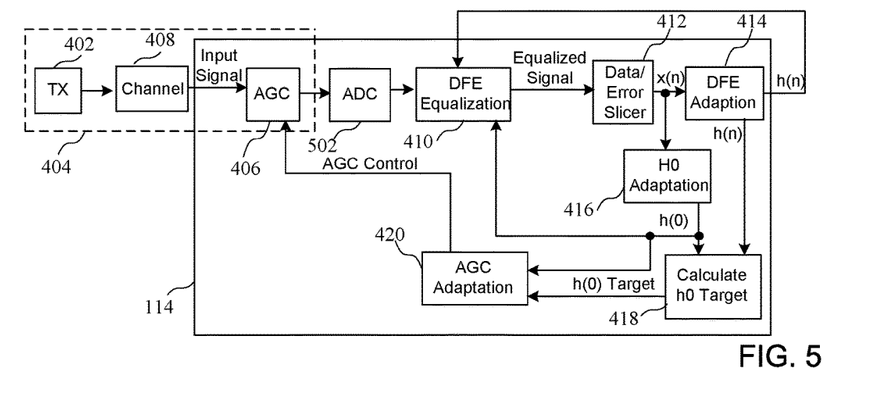
FIG. 5 is a block diagram of a circuit for enabling automatic gain control adaptation in a receiver having a DFE equalizer receiving an output of an analog-to-digital converter circuit.
Figure 7:
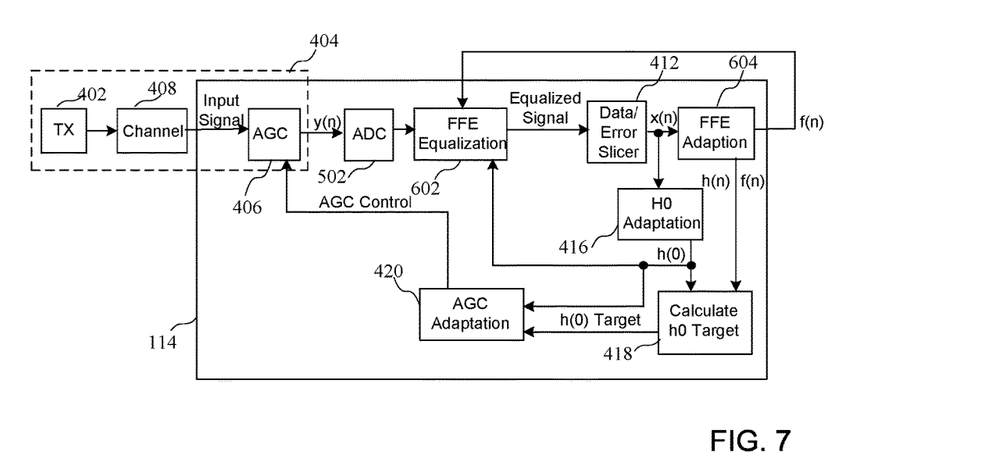
FIG. 7 is a block diagram of a circuit for enabling automatic gain control adaptation in a receiver having an FFE equalizer receiving an output of an analog-to-digital converter circuit.
Figure 9:
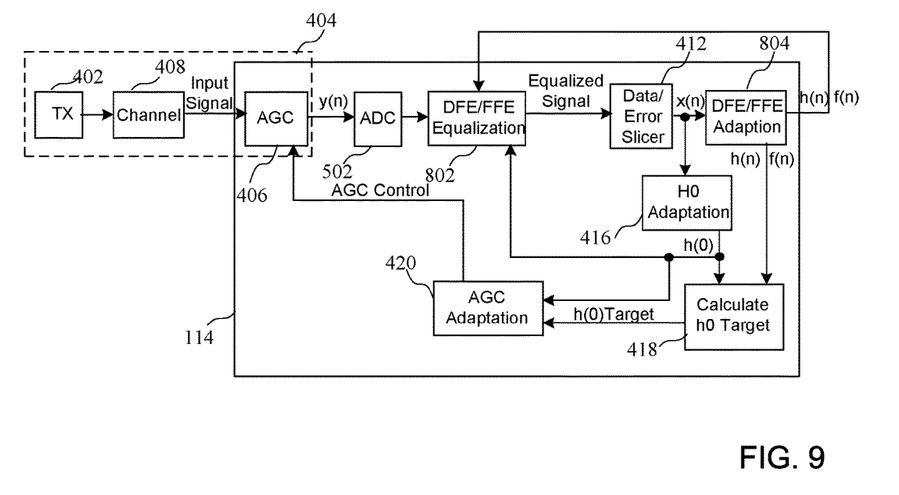
FIG. 9 is a block diagram of a circuit for enabling automatic gain control adaptation in a receiver having a combined DFE/FFE equalizer receiving an output of an analog-to-digital converter circuit.

Turning now to FIG. 5, a block diagram of a circuit for enabling automatic gain control adaptation in a receiver having a DFE equalizer receiving an output of an analog-to-digital converter circuit is shown. As shown in FIG. 5, an analog-to-digital converter (ADC) circuit 502 converts the boosted input signal at the output of the AGC circuit 406 to a digital signal to enable the adaptation control to be performed using digital signals. In many ADC based receiver designs, the gain is adjusted by monitoring the ADC code clipping rate, which can be strongly influenced by channel 151 profile, noise amount and crosstalk signature. As a result, the gain adjustment is less robust for different systems. The circuit of FIG. 5 maximizes the effective signal magnitude within an ADC full scale range by adapting the h(0) target based on the channel insertion loss in the presence of DFE. That is, the circuit of FIG. 5 enables the adaptation of the h(0) target based upon DFE to maximize the achievable h(0) within the full scale range. Circuits 7 and 9 also enable the adaptation of the h(0) target based upon FFE to maximize the achievable h(0) within the full scale range.

Figure 6:
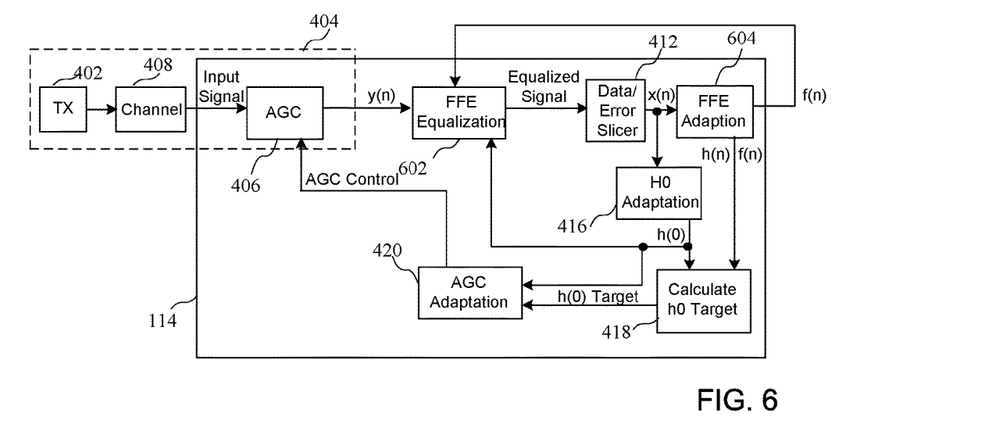
FIG. 6 is a block diagram of a circuit for enabling automatic gain control adaptation in a receiver having an FFE equalizer.

Turning now to FIG. 6, a block diagram of a circuit for enabling automatic gain control adaptation in a receiver having a feedforward equalizer is shown. Rather than implementing a decision feedback equalizer configured to receive the amplified input signal, a feedforward equalizer (FFE) 602 is implemented, and adaptation of the feedforward equalizer is implemented using a FFE adaptation circuit 604. Assuming FFE coefficients are f(m), then h(0) target can be approximated as:

$$h(0)\text{target}\approx A/(\max(x(n))\Sigma|f(n)|).$$

Unlike the DFE adaptation circuit 414, the FFE adaption circuit 604 only provides coefficients f(n) back to the FFE 602. The AGC adaptation circuit controls the AGC circuit as described above in reference to FIG. 4.

Turning now to FIG. 7, a block diagram of a circuit for enabling automatic gain control adaptation in a receiver having an FFE 602 receiving an output of an analog-to-digital converter circuit is shown. According to the implementation of FIG. 7, the ADC circuit 502 is implemented between the AGC circuit 406 and the FFE 602. The −ADC circuit 502 converts the boosted input signal at the output of the AGC circuit 406 to a digital signal to enable the adaptation control to be performed using digital signals.

Figure 8:
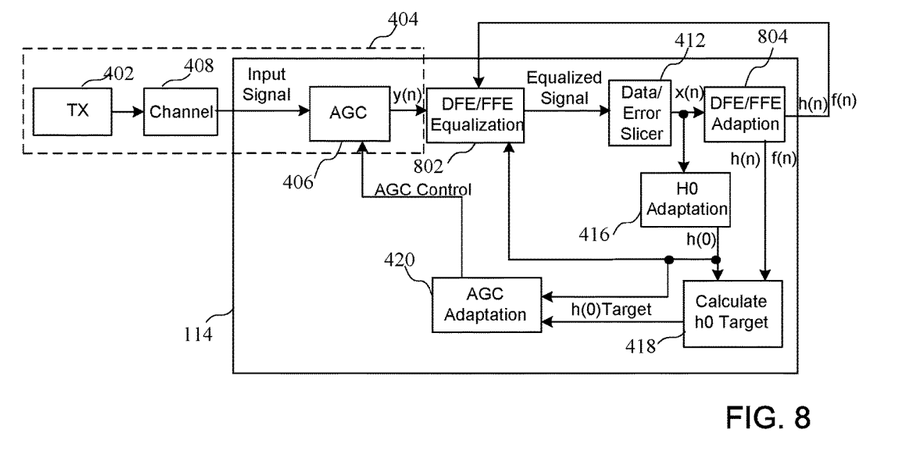
FIG. 8 is a block diagram of a circuit for enabling automatic gain control adaptation in a receiver having a combined DFE/FFE equalizer.

Turning now to FIG. 8, a block diagram of a circuit for enabling automatic gain control adaptation in a receiver having a combined DFE/FFE equalizer is shown. More particularly, a DFE/FFE equalization circuit 802 is implemented to receive the amplified input signal y(n), and generate the equalized signal. An adaptation of the DFE/FFE equalization circuit 802 is implemented using a DFE/FFE adaptation circuit 804, in which case both the output signals and coefficients are feed back to the DFE/FFE equalization circuit 802. If both DFE and FFE are used, the h(0) target will be approximated as:

$$h(0)\text{target}\approx A/(\max(x(n))(\Sigma|f(n)|+\Sigma|h(n)/h(0)|)).$$

Turning now to FIG. 9, a block diagram of a circuit for enabling automatic gain control adaptation in a receiver having a combined DFE/FFE equalizer receiving an output of an analog-to-digital converter circuit is shown. According to the implementation of FIG. 9, the ADC circuit 502 is implemented between the AGC circuit 406 and the DFE/FFE circuit 802. The ADC circuit 502 converts the boosted input signal at the output of the AGC circuit 406 to a digital signal to enable the adaptation control to be performed using digital signals.

Figure 10:
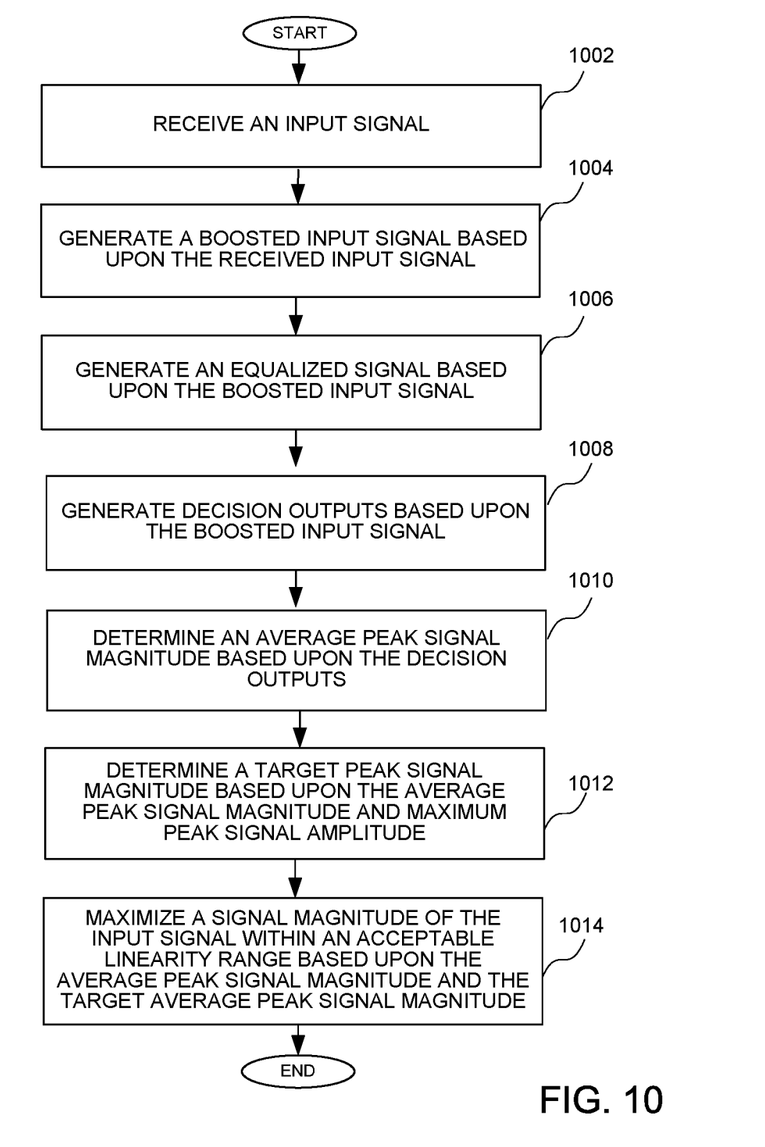
FIG. 10 is a flow chart showing a method of enabling the adaptation of an automatic gain control circuit in a circuit having a DFE equalizer.

Turning now to FIG. 10, a flow chart shows a method of enabling the adaptation of an automatic gain control circuit in a circuit having a DFE equalizer. In particular, an input signal is received at a block 1002, and a boosted input signal is generated at a block 1004. An equalized signal is generated based upon the boosted input signal at a block 1006. The equalized signal could be generated using any of the equalization circuits of FIGS. 5-9. Decision outputs are generated, such as by the data/error slicer 412, based upon the boosted input signal at a block 1008. An average peak signal magnitude h(0) is determined, such as by the average peak value magnitude adaptation circuit 416, based upon the decision outputs at a block 1010. A target peak signal magnitude h(0) target is determined, such as by using the average peak signal target calculation block 418, based upon the average peak signal magnitude and maximum peak signal amplitude at a block 1012. The effective signal magnitude is maximized within an acceptable linearity range based upon the average peak signal magnitude and the target average peak signal magnitude at a block 1014. The method of FIG. 10 could be implemented using the circuits of FIGS. 1-9 as described above, or other suitable circuits.

It can therefore be appreciated that new circuits for and methods of enabling the adaptation of an automatic gain control circuit associated with an equalizer has been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for enabling an adaptation of automatic gain control (AGC), the circuit comprising:
   an automatic gain control circuit configured to receive an input signal and to generate a boosted input signal;
   an equalization circuit configured to receive the boosted input signal generated by the automatic gain control circuit and to generate an equalized input signal;
   a decision circuit configured to receive the equalized input signal, wherein the decision circuit generates decision outputs based upon the equalized input signal;
   an average peak signal magnitude adaptation circuit configured to receive an output of the decision circuit and to generate an average peak signal magnitude;
   an average peak signal target calculation circuit configured to receive the average peak signal magnitude and a maximum peak signal amplitude, wherein the average peak signal magnitude adaptation circuit generates a target average peak signal magnitude; and
   an AGC adaptation circuit configured to receive an average peak signal magnitude and the target average peak signal magnitude, wherein the AGC adaptation circuit provides an AGC control signal to the AGC circuit to maximize the input signal magnitude within an acceptable linearity range.

2. The circuit of claim 1 wherein the AGC adaptation circuit maximizes the input signal magnitude within an acceptable linearity range by adapting the average peak signal magnitude based on a channel insertion loss.

3. The circuit of claim 1 further comprising an analog-to-digital converter circuit configured to receive the boosted input signal, wherein the AGC adaptation circuit maximizes the input signal magnitude within an ADC full scale range.

4. The circuit of claim 1 further comprising an equalization adaptation circuit configured to receive an output of the decision circuit, wherein output of the decision circuit is normalized to a signal without amplitude information.

5. The circuit of claim 1 wherein the equalization circuit comprises a decision feedback equalizer, the circuit further comprising an equalizer adaptation circuit that provides the pulse response back to the decision feedback equalizer.

6. The circuit of claim 5 wherein an average peak signal target calculation circuit selects a target average peak signal magnitude based upon a circuit linear range of the decision outputs.

7. The circuit of claim 1 wherein the equalization circuit comprises a feedforward equalizer, the circuit further comprising an equalizer adaptation circuit that provides equalizer coefficients back to the feedforward equalizer.

8. The circuit of claim 7 further comprising an analog-to-digital converter circuit, wherein an average peak signal target calculation circuit selects a target average peak signal magnitude based upon an ADC full scale range.

9. The circuit of claim 1 wherein the equalization circuit comprises a decision feedback equalizer and feedforward equalizer.

10. The circuit of claim 1 wherein the AGC adaptation circuit adjusts an AGC gain of the AGC circuit based upon a comparison of the average peak signal magnitude output and the target average peak signal magnitude.

11. A method of enabling an adaptation of automatic gain control, the method comprising:
    receiving an input signal;
    generating a boosted input signal based upon the received input signal;
    generating an equalized signal based upon the boosted input signal;
    generating decision outputs based upon the boosted input signal;
    determining an average peak signal magnitude based upon the decision outputs;
    determining a target peak signal magnitude based upon the average peak signal magnitude and a maximum peak signal amplitude; and
    maximizing a signal magnitude of the input signal within an acceptable linearity range based upon the average peak signal magnitude and the target average peak signal magnitude.

12. The method of claim 11 wherein maximizing a signal magnitude of the input signal within an acceptable linearity range is performed by adapting the average peak signal magnitude based on a channel insertion loss.

13. The method of claim 11 further comprising configuring an analog-to-digital converter circuit to receive the boosted input signal, and maximizing the signal magnitude of the input signal within an ADC full scale range.

14. The method of claim 11 further comprising normalizing the decision outputs to a signal without amplitude information.

15. The method of claim 11 further comprising implementing a decision feedback equalizer adaptation circuit to provide the pulse response back to the decision feedback equalizer.

16. The method of claim 15 further comprising selecting a target average peak signal magnitude based upon a circuit linear range.

17. The method of claim 11 further comprising enabling adaptation of an equalizer circuit by providing equalizer coefficients back to an equalizer circuit.

18. The method of claim 17 further comprising selecting a target average peak signal magnitude based upon an ADC full scale range.

19. The method of claim 11 further comprising providing decision feedback equalization and feedforward equalization.

20. The method of claim 11 further comprising adjusting the AGC gain based upon a comparison of the average peak signal magnitude and the target average peak signal magnitude.

* * * * *